(12) United States Patent
Bosboom

(10) Patent No.: US 12,272,587 B2
(45) Date of Patent: Apr. 8, 2025

(54) APPARATUS, SYSTEM AND METHOD FOR PROVIDING A FIBER OPTIC COUPLER

(71) Applicant: JABIL INC., St. Petersburg, FL (US)

(72) Inventor: Jeroen Bosboom, St. Petersburg, FL (US)

(73) Assignee: JABIL INC.

( * ) Notice: Subject to any disclaimer, the term of this patent is extended or adjusted under 35 U.S.C. 154(b) by 428 days.

(21) Appl. No.: 17/800,525

(22) PCT Filed: Feb. 17, 2020

(86) PCT No.: PCT/US2020/018498
§ 371 (c)(1),
(2) Date: Aug. 17, 2022

(87) PCT Pub. No.: WO2021/167583
PCT Pub. Date: Aug. 26, 2021

(65) Prior Publication Data
US 2023/0109204 A1 Apr. 6, 2023

(51) Int. Cl.
*H04B 10/00* (2013.01)
*H01L 21/67* (2006.01)
(Continued)

(52) U.S. Cl.
CPC .. *H01L 21/68707* (2013.01); *H01L 21/67259* (2013.01); *H01L 21/681* (2013.01); *H04B 10/801* (2013.01)

(58) Field of Classification Search
CPC .................................. G02B 6/36; G02B 6/3604
See application file for complete search history.

(56) References Cited

U.S. PATENT DOCUMENTS 6,256,555 B1 7/2001 Bacchi
6,629,053 B1 9/2003 Mooring
(Continued)

FOREIGN PATENT DOCUMENTS

JP 2013154406 A 8/2013
JP 2014130866 A 7/2014

OTHER PUBLICATIONS

International Search Report for PCT/US2020/018498, dated Nov. 13, 2020.
(Continued)

*Primary Examiner* — Daniel G Dobson
(74) *Attorney, Agent, or Firm* — Riverside Law LLP

(57) ABSTRACT

An apparatus, system and method for providing an optical coupler. The optical coupler may be a miniature fiber optic coupler, which may include: a housing having dimensions of less than 4 mm×4 mm×4 mm; an input into the housing capable of receiving a fiber optic sending line; a sending line prism having dimensions of less than 2 mm×2 mm within the housing in optical communication with the sending line; a receiving line prism having dimensions of less than 2 mm×2 mm in optical communication with the sending line prism at a corresponded angle in a range of 30 to 60 degrees and capable of receiving a signal incoming on the sending line and redirecting the received signal; and a receiving line in optical communication with the receiving line prism and capable of receiving and outputting the redirected received signal.

20 Claims, 5 Drawing Sheets

(51) Int. Cl.
*H01L 21/68* (2006.01)
*H01L 21/687* (2006.01)
*H04B 10/80* (2013.01)
*H04J 14/00* (2006.01)

(56) References Cited

U.S. PATENT DOCUMENTS

| | | |
|---|---|---|
| 2002/0042666 A1 | 4/2002 | Bacchi |
| 2006/0222480 A1 | 10/2006 | Duhamel et al. |
| 2009/0095886 A1 | 4/2009 | van der Meulen |
| 2010/0034621 A1 | 2/2010 | Martin |
| 2012/0101633 A1 | 4/2012 | Rodnick |
| 2016/0018599 A1* | 1/2016 | Zhang .................. G02B 6/3628 385/24 |
| 2019/0393070 A1 | 12/2019 | Bosboom et al. |
| 2020/0159029 A1* | 5/2020 | Adema ................ G02B 6/3604 |

OTHER PUBLICATIONS

Written Opinion of the International Searching Authority for PCT/US2020/018498, dated Nov. 13, 2020.

* cited by examiner

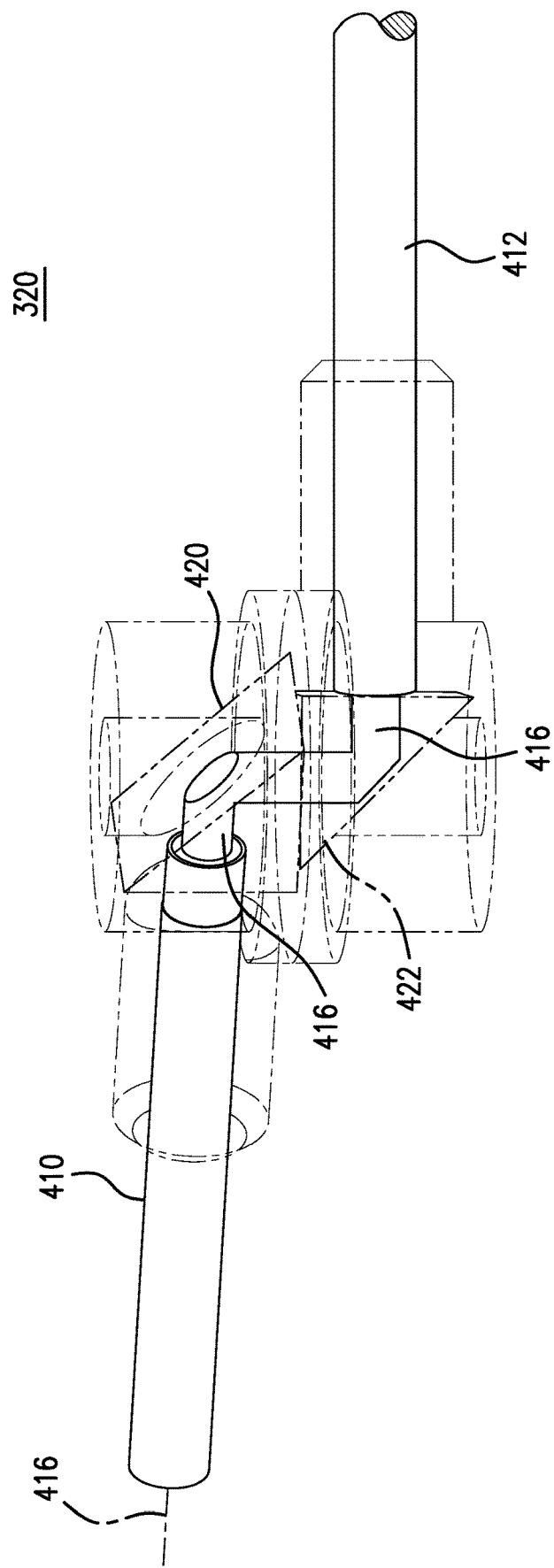

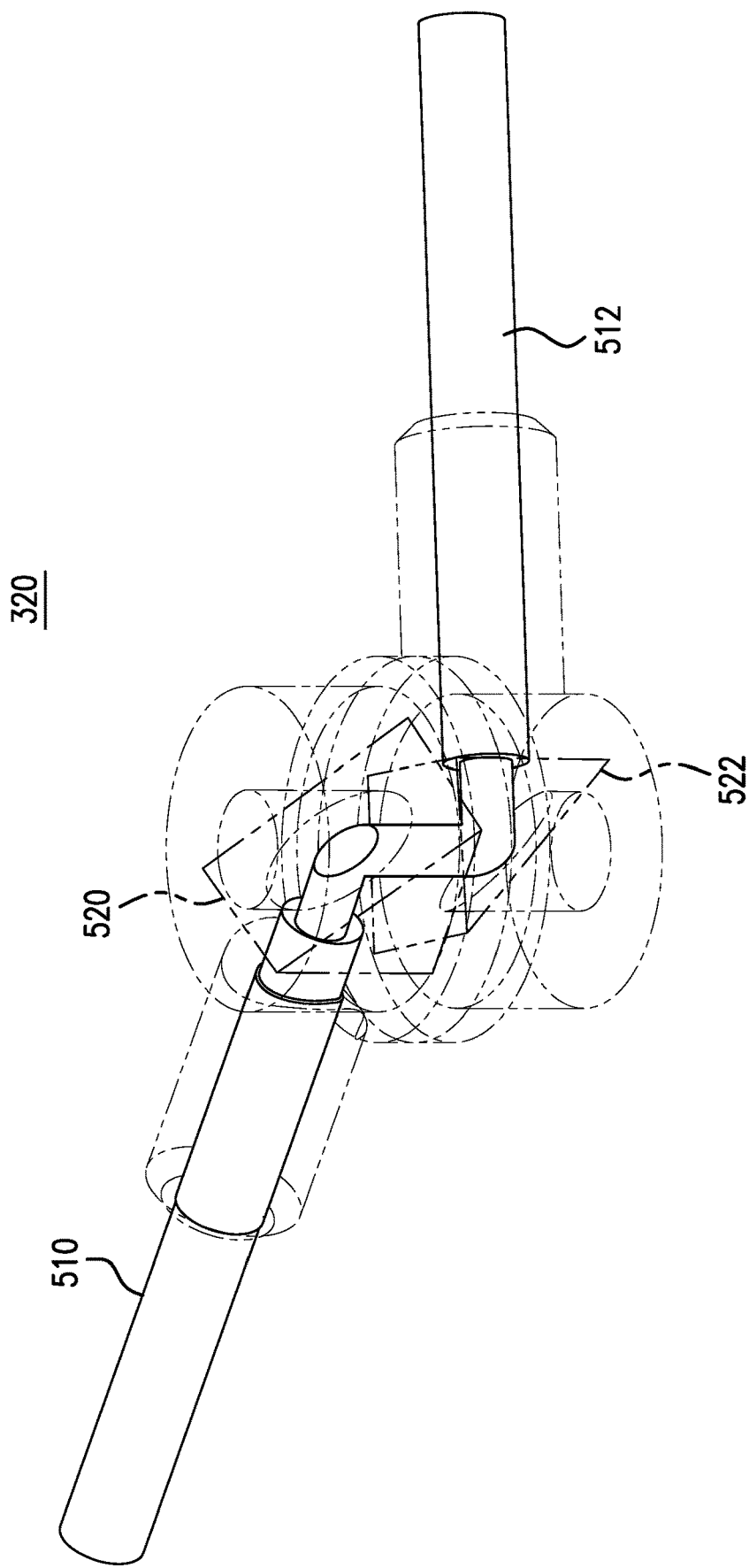

APPARATUS, SYSTEM AND METHOD FOR PROVIDING A FIBER OPTIC COUPLER

CROSS-REFERENCE TO RELATED APPLICATION

This application claims the benefit of priority to International Application No. PCT/US2020/018498, filed Feb. 17, 2020; entitled APPARATUS, SYSTEM AND METHOD FOR PROVIDING A FIBER OPTIC COUPLER, the entirety of which is incorporated herein by reference as if set forth in its entirety.

BACKGROUND

Field of the Disclosure

The present disclosure relates to fiber optics, and, more particularly, to a fiber optic coupler such as may be embedded in a base for mechanical association with an end effector used for gripping semiconductor wafers.

Description of the Background

Robotic wafer handlers are used in the semiconductor arts to handle semiconductor wafers during various semiconductor processing steps. Such processing steps may include, by way of example, chemical mechanical planarization (CMP), etching, deposition, passivation, and various other processes in which a sealed and/or "clean" environment must be maintained, such as to limit the likelihood of contamination and to ensure that various specific processing conditions are met.

Current practice in the semiconductor arts to robotically handle these wafers often includes the use of an end effector operably attached to robotics, such as in order to load semiconductor wafers from a loading stack into the various processing ports that may correspond to the aforementioned exemplary processing steps. That is, motorized robotics are employed to deploy the end effector to retrieve the wafer from a particular port or stack, such as before and/or after processing in an associated process chamber. The wafer may thus be shuttled by the end effector to subsequent ports for additional processing. When the wafer processing stages are complete, the robotics may then return the processed semiconductor wafer to a loading port, and may, again using the end effector, then retrieve the next wafer for processing by the system. It is typical that a stack of several semiconductor wafers is processed in this manner using the end effector during each process run.

In the current state of the art, wafer handling, and specifically end effectors, for semiconductor processes are often comprised of different types of servo-driven, movable wafer handling end effector arms for use in various circumstances. By way of nonlimiting example, such movable end effector arms may be straight in shape, doglegged in shape, or of various other shapes, to best move wafers of varying sizes and shapes between and within semiconductor processes, as referenced above. Further, it is typically the case that these servo driven arms also provide built-in "tip mapping", which senses the presence of a wafer, or aspects thereof, at the distal end of the end effector arm from the driving servo motor in a base which drives actuation of the arms.

As referenced throughout, it is often the case that these various shapes of servo driven arms may need to be swapped out for differing semiconductor applications. This necessarily means that the interconnection of the fiberoptics, such as those employed in the aforementioned tip mapping, which run from the end effector servo base to the distal end of the end effector arm, must also be swapped out along with the servo driven arms. However, swapping these movable arms is often costly and time-consuming in the known art, at least because the previously mentioned very small (on the order of 1 mm) fiber optics, which are embedded in the arms and which pass along the length of the arm into an amplifier in the end effector base, preclude quick disconnection and realignment of the fiber optics in a manner suitable to provide continued operability of the tip mapping when the arms are swapped.

More particularly, there are presently no miniature scale optical couplers provided in the semiconductor wafer handling, or related, art. Indeed, the aforementioned difficulties arise not only in the wafer processing environments, but further in all environments necessitating expedited switch outs or automated high-volume interconnections of disparate fiber-optic lines.

SUMMARY

Certain embodiments are and include an apparatus, system and method for providing an optical coupler. The optical coupler may be a miniature fiber optic coupler, which may include: a housing having dimensions of less than 4 mm×4 mm×4 mm; an input into the housing capable of receiving a fiber optic sending line; a sending line prism having dimensions of less than 2 mm×2 mm within the housing in optical communication with the sending line; a receiving line prism having dimensions of less than 2 mm×2 mm in optical communication with the sending line prism at a corresponded angle in a range of 30 to 60 degrees and capable of receiving a signal incoming on the sending line and redirecting the received signal; and a receiving line in optical communication with the receiving line prism and capable of receiving and outputting the redirected received signal.

The sending line may be in optical communication with a sensor. The sensor may be an optical sensor. The optical sensor may comprise a presence sensor, such as a tip mapping sensor. The presence sensor may sense a presence of a semiconductor wafer.

The sending line may pass longitudinally through an end effector for semiconductor processing. The redirected received signal may be provided to a processing system. The housing may be substantially rectangular. Each of the sending prism and the receiving prism may have a relative orientation with respect to a vertical axis through the housing of 45 degrees.

The embodiments may additionally include a wafer handling system. The wafer handling system may have at least one end effector arm capable of accommodating a portion of a semiconductor wafer at an end thereof and having an optical presence sensor at an end thereof proximate to the portion of the semiconductor wafer, and may include: a mechanical attachment plane along the end effector arm and perpendicular to a longitudinal axis of the end effector arm which is suitable to receive thereupon a connective plane from a robotic base; a fiber optic sending line connective between the optical presence sensor and the mechanical attachment plane; and a fiber optic coupler.

The fiber optic coupler may include: a housing; an input in the housing capable of receiving the fiber optic sending line proximate to the mechanical attachment plane; a sending line prism within the housing in optical communication with the sending line; a receiving line prism in optical communication with the sending line prism and capable of receiving a signal from the optical presence sensor and of redirecting the received signal; and a receiving line in optical communication with the receiving line prism and capable of receiving and outputting the redirected received signal. The redirected received signal may be provided to a processing system associated with the robotic base.

The sending line prism and the receiving line prism may have a height and width each of less than 2 mm. The housing may be substantially rectangular and may have a width, length and depth each of less than 4 mm. The mechanical attachment plane may have a height of less than 4 mm.

The wafer handling may include at least two end effector arms, synchronized in motion. The receiving line may be routed around a driver of the end effector arm in the robotic base. The receiving line may be routed through the robotic base to at least one computer processing system.

Thus, the disclosure provides at least an apparatus, system and method for providing a miniature scale optical coupler.

BRIEF DESCRIPTION OF THE DRAWINGS

The exemplary compositions, systems, and methods shall be described hereinafter with reference to the attached drawings, which are given as non-limiting examples only, in which:

FIG. 4 is a profile illustration of a fiber-optic coupler; and

FIG. 5 is a top profile illustration of a fiber-optic coupler.

DETAILED DESCRIPTION

Figure 1:
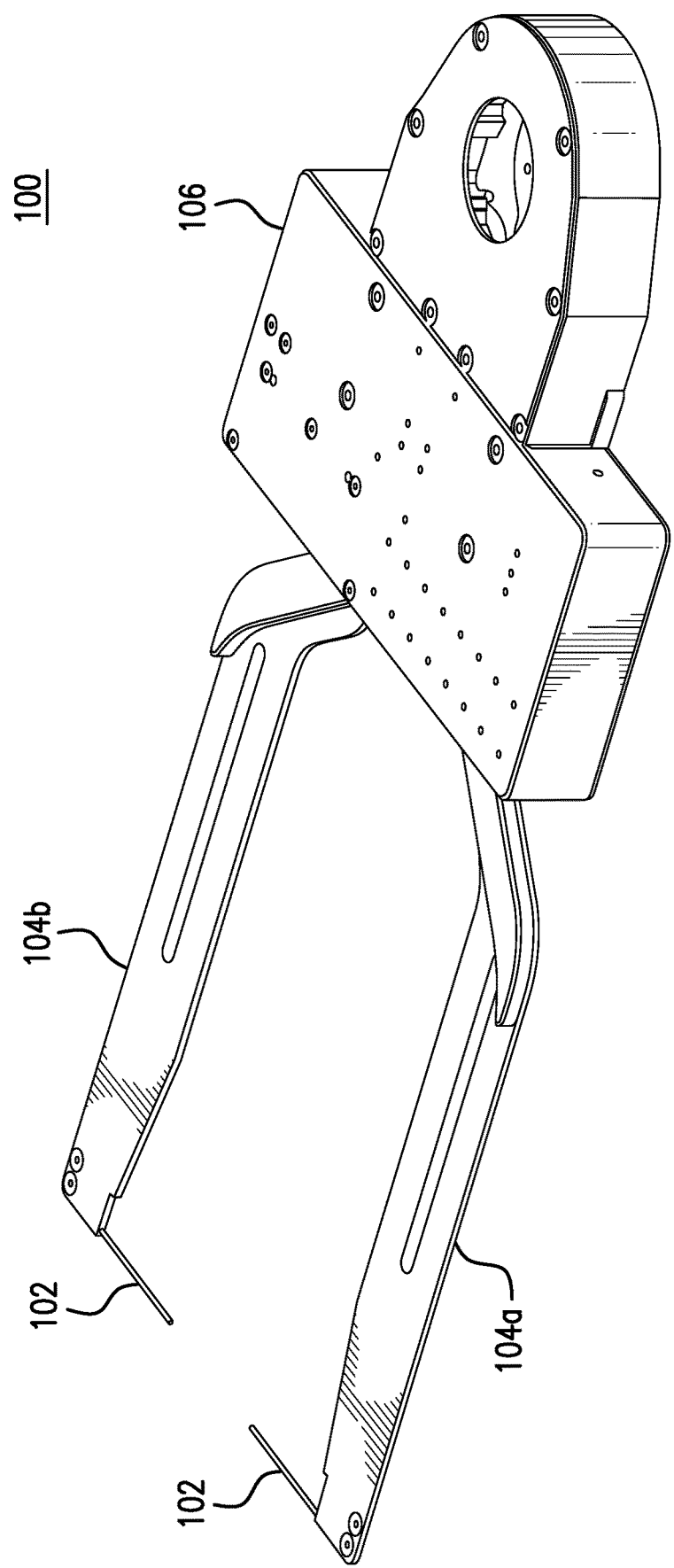
FIG. 1 illustrates an end effector having tip mapping.

The figures and descriptions provided herein may have been simplified to illustrate aspects that are relevant for a clear understanding of the herein described apparatuses, systems, and methods, while eliminating, for the purpose of clarity, other aspects that may be found in typical similar devices, systems, and methods. Those of ordinary skill may thus recognize that other elements and/or operations may be desirable and/or necessary to implement the devices, systems, and methods described herein. But because such elements and operations are known in the art, and because they do not facilitate a better understanding of the present disclosure, for the sake of brevity a discussion of such elements and operations may not be provided herein. However, the present disclosure is deemed to nevertheless include all such elements, variations, and modifications to the described aspects that would be known to those of ordinary skill in the art.

Embodiments are provided throughout so that this disclosure is sufficiently thorough and fully conveys the scope of the disclosed embodiments to those who are skilled in the art. Numerous specific details are set forth, such as examples of specific components, devices, and methods, to provide a thorough understanding of embodiments of the present disclosure. Nevertheless, it will be apparent to those skilled in the art that certain specific disclosed details need not be employed, and that embodiments may be embodied in different forms. As such, the disclosed embodiments should not be construed to limit the scope of the disclosure. As referenced above, in some embodiments, well-known processes, well-known device structures, and well-known technologies may not be described in detail.

The terminology used herein is for the purpose of describing particular embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The steps, processes, and operations described herein are not to be construed as necessarily requiring their respective performance in the particular order discussed or illustrated, unless specifically identified as a preferred or required order of performance. It is also to be understood that additional or alternative steps may be employed, in place of or in conjunction with the disclosed aspects.

When an element or layer is referred to as being "on", "upon", "connected to" or "coupled to" another element or layer, it may be directly on, upon, connected or coupled to the other element or layer, or intervening elements or layers may be present, unless clearly indicated otherwise. In contrast, when an element or layer is referred to as being "directly on," "directly upon", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). Further, as used herein the term "and/or" includes any and all combinations of one or more of the associated listed items.

Yet further, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another element, component, region, layer or section. Thus, terms such as "first," "second," and other numerical terms when used herein do not imply a sequence or order unless clearly indicated by the context. Thus, a first element, component, region, layer or section discussed below could be termed a second element, component, region, layer or section without departing from the teachings of the embodiments.

The embodiments enable the expedited connection and disconnection of fiber-optic lines, such as at an intersection of aspects of those lines along a mechanical attachment plane. This mechanical attachment plane may include, by way of nonlimiting example, the connection and disconnection plane of servo driven end effector arms to an end effector base connector in a wafer processing environment. However, it will be appreciated by the skilled artisan in light of the discussion herein that various other environments may make use of the miniature fiber-optic coupling discussed throughout.

In sum, the embodiments may include the routing of a sending fiber into a miniature terminal comprised of small, angled mirror prisms, with an identical or substantially identical receiving prism directly or substantially directly in optical communication with the sending fiber prism, with the receiving prism routed into a receiving fiber. As discussed herein, the sending and receiving prisms may be at matched 45° angles, although it will be understood that other angles and/or respective prism dispositions may be used without departing from the scope of the disclosure.

The connecting terminal discussed above may be embedded in or otherwise include mechanical features, including an insert "plug" for the sending and receiving fibers, such may reside in the end effector arm at the mechanical union plane with an end effector base arm attachment in the exemplary embodiments discussed throughout. As the small size of the prisms, such as on the order of 1-5 millimeters, or more particularly 2 millimeters, in width may provide for a terminal on the order of 2 to 7 mm in thickness, the prisms within the prism holder may be simplistically embedded in, for example, the end effector arm at the attachment plane as discussed throughout, without any increase in the size or thickness of the end effector arm.

More particularly, the embedded substrate thickness within the end effector arms may be as thin as 1.5 mm for those aspects of the arm used in beam mapping. Accordingly, the inclusion of the prismatic terminal discussed herein may, in embodiments, require no modification to the typical beam mapping aspects. This is particularly the case in instances wherein an end effector arm at its associated mounting block, i.e., the end effector base, provides a flush, substantially planar surface for the mounting of removable mechanical tooling. That is, the removable arms may mount to the base containing the servo drive to allow for the wafer handling discussed herein throughout, as the disclosed thin prismatic terminal may provide a substantially flush connection along the planar connection surface. The planar face of this connection is much smaller in area than the total surface area of the arm's connection plane itself. Accordingly, while single channel, i.e., single fiber, applications may be typical, the broadened interconnection planar area provided by the flush mechanical connection surface provides an opportunity to provide multiple interconnections for multiple fiber channels, such as in close proximity, because the planar area of each interconnection is much smaller than the total connection plane surface area, which allows for more complex fiber-optic applications.

Therefore, the embodiments provide the ability to couple and uncouple fiberoptics as easily as coupling or uncoupling a mechanical, pneumatic or standard electrical circuit. Thus, the embodiments enable advanced solutions in manufacturing assembly, disassembly, product modification, and testing environments. Further, the small scale of the disclosed fiber-optic coupling may allow for embedding of the coupling in various environments without physical modification of the mechanical aspects into which such a fiber-optic coupling is embedded. That is, the embodiments make practical the expedited switch out of through-beam and reflective sensing elements, among other sensing and fiber-optic aspects, in a great variety of settings.

FIG. 1 illustrates an end effector 100 having tip mapping 102. More particularly, the end effector 100 includes thin distal arms 104a, b that may synchronously or asynchronously be moved closer together, farther apart, and, in some embodiments, closer to or farther from the end effector base 106 illustrated in FIG. 1.

Figure 2:
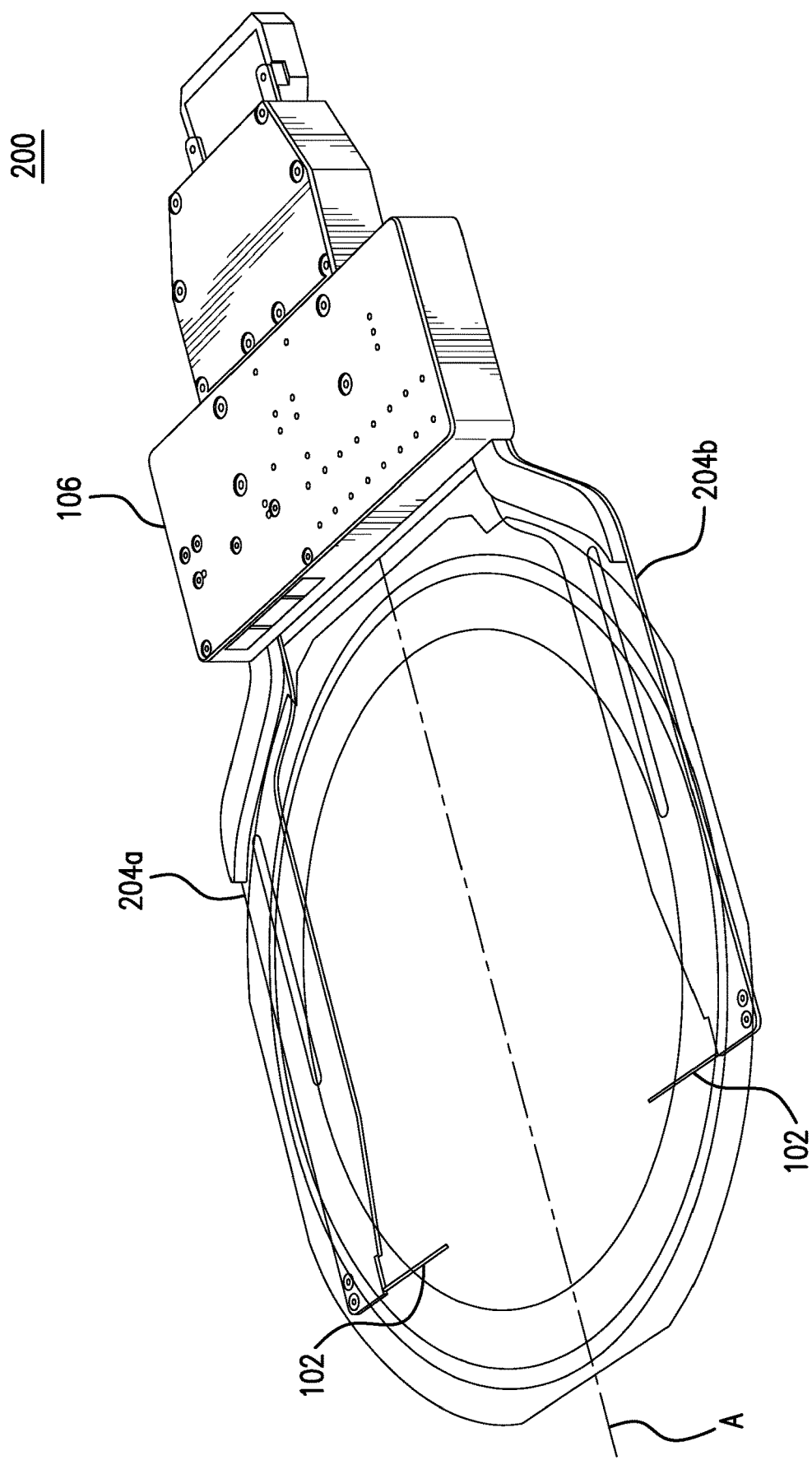
FIG. 2 illustrates an end effector having distal arms synchronously expandable outward from a central axis in order to accommodate thereon a semiconductor wafer.

FIG. 2 illustrates an end effector 200 similar to that shown in FIG. 1, but with the distal arms 204a, b synchronously expanded outward from a central axis (axis "A") in order to accommodate thereon a semiconductor wafer. The tip mapping 102 is again shown in the embodiment of FIG. 2.

Figure 3:
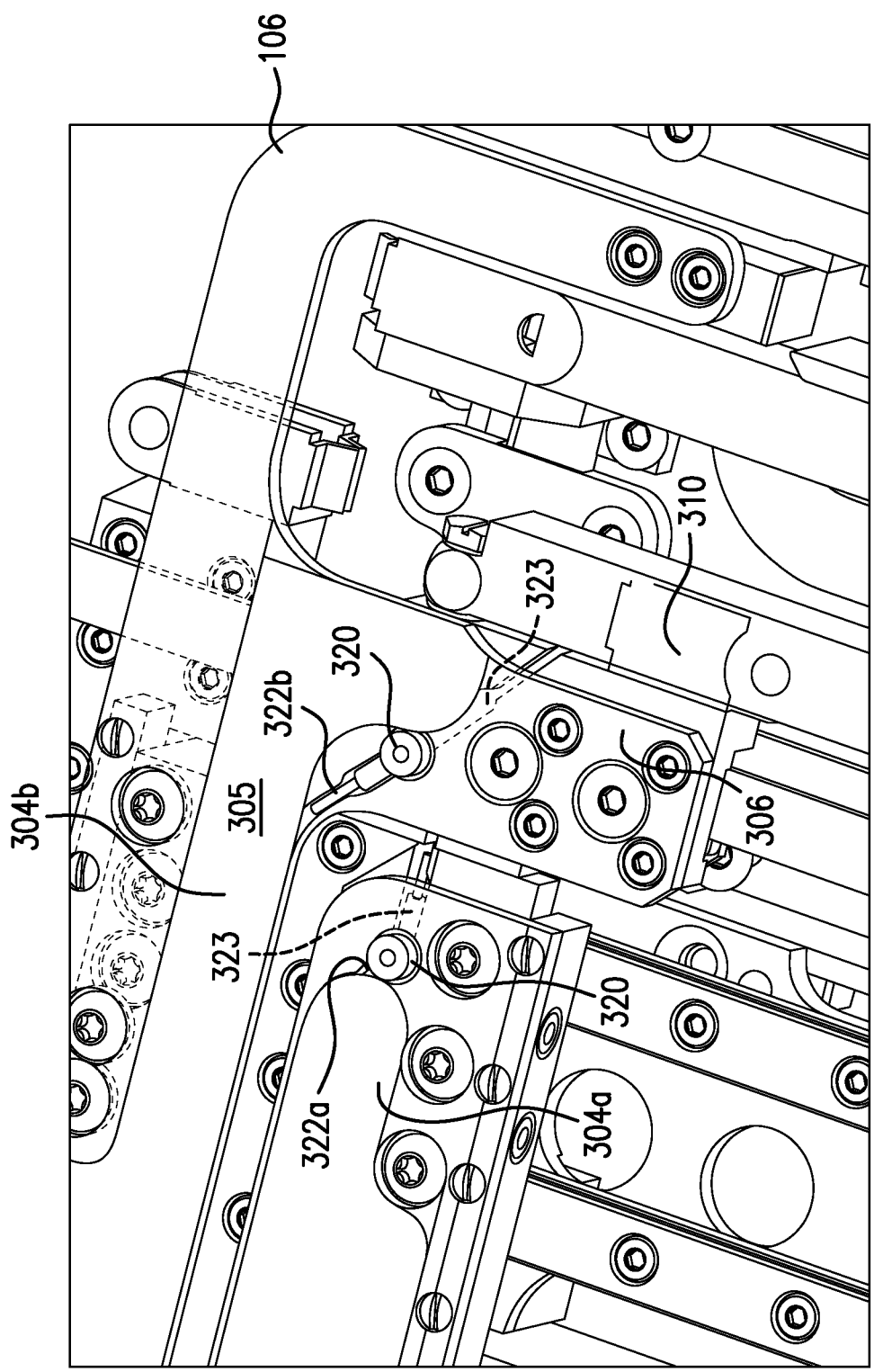
FIG. 3 is a cross-sectional illustration of an end effector base with movable arms synchronously brought together.

FIG. 3 is a cross-sectional illustration of the end effector base 106 illustrated in FIGS. 1 and 2. In the illustration of FIG. 3, the arms 304a, b akin to those shown in FIGS. 1 and 2, have been brought synchronously together towards the center axis, "A", to their closest point.

Within the base 106, each of the right and left arms 304, a, b is shown to have, proximate to the interconnection point of each arm extension portion 305 with its respective mechanically driven portion 306 in mechanical association with a mechanical driver 310 within the base 106, a miniature fiber-optic coupling 320 in accordance with the embodiments. As shown, each fiber-optic coupling 320 is integrated with a fiber-optic line 322a, b that extends from the coupling point/plane at the intersection of the arm extension portions 305 and the mechanically driven portions 306 down each of the respective end effector arms 104, 204, 304 to the tip mapping 102 illustrated in FIGS. 1 and 2.

Moreover, each of the fiber-optic couplings 320 is coupled to an interconnection 323 associated with the mechanical driving hardware 310 for that arm 104, 204, 304, which interconnection is within the base 106. This interconnection 323 within the base 106 allows signals passing down the fiberoptics 322a, b from the tip mapping 102 and along the arms to pass through and out of the fiber-optic coupler 320 and along the driving hardware 310, such as to be passed elsewhere within or outside the base, such as to ultimately by provided to a processing system.

FIG. 4 is a profile illustration of the disclosed fiber-optic coupler 320. As illustrated, the coupler 320 may include interconnection to sending and receiving lines 410, 412, which may respectively feed or receive a fiber optical data signal 416 from corresponded sending and receiving mirror prisms 420, 422.

It will be understood that the fiber optic data signal 416 has some "spread" across the prismatic mirrored surfaces as it exits the sending line 410, but the alignment between the disclosed sending and receiving prisms 420, 422 may be non-critical, and/or may necessitate only simple and common alignment techniques. By way of example, a 0.4 core sending fiber with a 2 mm wide mirror allows a 1.25 shift in the X or Y axis, or a combined shift in multiple axes of 0.75, with zero signal loss. Therefore, the coupling alignment is not a critical factor in the disclosed embodiments.

As referenced above, sub-1 millimeter, 1 millimeter, 2 millimeter, or larger mirrored or like-prisms may be used in the embodiments, although the skilled artisan will appreciate that the size of the disclosed fiber-optic coupling 320 depends, in part, on the size of the prisms 420, 422 employed therein. Further, although the embodiment of FIG. 4 illustrates prisms 420, 422 at approximately 45° angles to one another, it will be understood that other angle pairings may be employed as will be understood to the skilled artisan.

FIG. 5 is a top profile illustration of a fiber-optic coupling 320 in accordance with the embodiments. Although similar to the embodiment of FIG. 4, FIG. 5 illustrates that the sending and receiving lines 510, 512, and, accordingly, the corresponded send and receive prisms 520, 522, may be rotationally misaligned to varying degrees, with respect to a center axis through the disclosed fiber-optic coupling 320, without adversely affecting performance of the fiber-optic coupling 320. That is, rotation of the disclosed prisms 520, 522, and more specifically the center points thereof, with respect to one another in and of itself effects no signal loss, as long as a substantial alignment between the center points of the respective prisms 520, 522 is maintained within the bounds of the optical signal's spread discussed above.

Of additional note, the angular relationship between the send and receive prisms may vary, as discussed throughout and as illustrated in the varying angular relationships of the send and receive prisms in FIGS. 4 and 5. Moreover, it will be appreciated that the sending and receiving lines may be received into ports, such as push to lock or twist to lock ports, associated with the coupling housing 320. That is, the lines may simply be inserted into the ports of the coupling housing, or may require additional physical manipulation beyond insertion, such as twisting, by way of non-limiting example.

The foregoing apparatuses, systems and methods may also include the control of the various robotic functionality and optical sensing referenced throughout. Such control may include, by way of non-limiting example, manual control using one or more user interfaces, such as a controller, a keyboard, a mouse, a touch screen, or the like, to allow a user to input instructions for execution by software code associated with the robotics and with the systems discussed herein. Additionally, and as is well known to those skilled in the art, system control may also be fully automated, such as wherein manual user interaction only occurs to "set up" and program the referenced functionality, i.e., a user may only initially program or upload computing code to carry out the predetermined movements and operational sequences based on the sensing discussed throughout. In either a manual or automated embodiment, or in any combination thereof, the control may be programmed, for example, to relate the known presence or positions of wafers, the bearing arm, the fork portion, and so on.

It is appreciated that exemplary embodiments herein are merely illustrative of environments in which the herein described systems and methods may operate, and thus do not limit the implementation of the herein described systems and methods in environments and applications having differing components and configurations. That is, the concepts described herein may be implemented in various environments and applications using various components and configurations.

Further, the descriptions of the disclosure are provided to enable any person skilled in the art to make or use the disclosed embodiments. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but rather is to be accorded the widest scope consistent with the principles and novel features disclosed herein.

What is claimed is:

1. A wafer handling system having at least one end effector arm capable of accommodating a portion of a semiconductor wafer at an end thereof and having an optical presence sensor at an end thereof proximate to the portion of the semiconductor wafer, comprising:
    a mechanical attachment plane along the end effector arm and perpendicular to a longitudinal axis of the end effector arm which is suitable to receive thereupon a connective plane from a robotic base;
    a fiber optic sending line connective between the optical presence sensor and the mechanical attachment plane; and
    a fiber optic coupler, comprising:
        a housing;
        an input in the housing capable of receiving the fiber optic sending line proximate to the mechanical attachment plane;
        a sending line prism within the housing in optical communication with the sending line;
        a receiving line prism in optical communication with the sending line prism and capable of receiving a signal from the optical presence sensor and of redirecting the received signal;
        a receiving line in optical communication with the receiving line prism and capable of receiving and outputting the redirected received signal;
    wherein the redirected received signal is provided to a processing system associated with the robotic base.

2. The wafer handling system of claim 1, wherein both the sending line prism and the receiving line prism have a height and width each of less than 2 mm.

3. The wafer handling system of claim 1, wherein the housing is substantially rectangular and has a width, length and depth each of less than 4 mm.

4. The wafer handling system of claim 1, wherein the mechanical attachment plane has a height of less than 4 mm.

5. The wafer handling system of claim 1, herein each of the sending prism and the receiving prism has a relative orientation with respect to a vertical axis through the housing of 45 degrees.

6. The wafer handling system of claim 1, wherein the optical presence sensor comprises tip mapping.

7. The wafer handling system of claim 1, comprising at least two of the end effector arms, synchronized in motion.

8. The wafer handling system of claim 1, wherein the receiving line is routed around a driver of the end effector arm in the robotic base.

9. The wafer handling system of claim 1, wherein the receiving line is routed through the robotic base to at least one computer processing system.

10. The wafer handling system of claim 1, wherein a relative alignment of the sending line prism and the receiving line prism allows for a single prism spread of at least 1.25, and a combined prism spread of at least 0.75, without signal loss.

11. A fiber optic coupler, comprising:
    a housing having dimensions of less than 4 mm×4 mm×4 mm;
    an input into the housing capable of receiving a fiber optic sending line;
    a sending line prism having dimensions of less than 2 mm×2 mm within the housing in optical communication with the sending line;
    a receiving line prism having dimensions of less than 2 mm×2 mm in optical communication with the sending line prism at a corresponded angle in a range of 30 to 60 degrees and capable of receiving a signal incoming on the sending line and redirecting the received signal; and
    a receiving line in optical communication with the receiving line prism and capable of receiving and outputting the redirected received signal.

12. The fiber optic coupler of claim 11, wherein the sending line is in optical communication with a sensor.

13. The fiber optic coupler of claim 12, wherein the sensor is an optical sensor.

14. The fiber optic coupler of claim 13, wherein the optical sensor comprises a tip mapping sensor.

15. The fiber optic coupler of claim 13, wherein the optical sensor comprises a presence sensor.

16. The fiber optic coupler of claim 15, wherein the presence sensor senses a presence of a semiconductor wafer.

17. The fiber optic coupler of claim 16, wherein the sending line passes longitudinally through an end effector for semiconductor processing.

18. The fiber optic coupler of claim 11, wherein the redirected received signal is provided to a processing system.

19. The fiber optic coupler of claim 11, wherein the housing is substantially rectangular.

20. The fiber optic coupler of claim 11, wherein each of the sending prism and the receiving prism has a relative orientation with respect to a vertical axis through the housing of 45 degrees.

\* \* \* \* \*